(12) United States Patent
Bi et al.

(10) Patent No.: US 10,438,855 B2
(45) Date of Patent: Oct. 8, 2019

(54) DUAL CHANNEL FINFETS HAVING UNIFORM FIN HEIGHTS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Peng Xu, Guilderland, NY (US); Jie Yang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 15/435,627

(22) Filed: Feb. 17, 2017

(65) Prior Publication Data
US 2018/0240713 A1 Aug. 23, 2018

(51) Int. Cl.
*H01L 21/8238* (2006.01)
*H01L 27/092* (2006.01)
(Continued)

(52) U.S. Cl.
CPC .. *H01L 21/823821* (2013.01); *H01L 21/3085* (2013.01); *H01L 21/76224* (2013.01); *H01L 21/823412* (2013.01); *H01L 21/823431* (2013.01); *H01L 21/823807* (2013.01); *H01L 27/0886* (2013.01); *H01L 27/0924* (2013.01); *H01L 29/36* (2013.01); *H01L 29/66795* (2013.01); *H01L 29/785* (2013.01); *H01L 29/7854* (2013.01); *H01L 21/02532* (2013.01); *H01L 21/20* (2013.01); *H01L 21/2205* (2013.01); *H01L 21/228* (2013.01); *H01L 21/2236* (2013.01); *H01L 21/2251* (2013.01); *H01L 21/2652* (2013.01); *H01L 21/308* (2013.01); *H01L 21/30608* (2013.01); *H01L 21/8213* (2013.01); *H01L 21/8252* (2013.01);
(Continued)

(58) Field of Classification Search
CPC ..... H01L 21/823821; H01L 21/823807; H01L 27/0924
See application file for complete search history.

(56) References Cited

U.S. PATENT DOCUMENTS

| | | |
|---|---|---|
| 6,265,317 B1 | 7/2001 | Chiu et al. |
| 7,198,995 B2 | 4/2007 | Chidambarrao et al. |

(Continued)

OTHER PUBLICATIONS

List of IBM Patents or Patent Applications Treated as Related; (Appendix P), Filed Mar. 26, 2018; 2 pages.
(Continued)

*Primary Examiner* — Jamie C Niesz
(74) *Attorney, Agent, or Firm* — Cantor Colburn LLP; Vazken Alexanian

(57) ABSTRACT

A method of making a semiconductor device including forming a first blanket layer on a substrate; forming a second blanket layer on the first blanket layer; patterning a first fin of a first transistor region and a second fin of a second transistor region in the first blanket layer and the second blanket layer; depositing a mask on the second transistor region; removing the first fin to form a trench; growing a first semiconductor layer in the trench where the first fin was removed; and growing a second semiconductor layer on the first semiconductor layer.

7 Claims, 10 Drawing Sheets

(51) Int. Cl.

| | | |
|---|---|---|
| *H01L 29/78* | (2006.01) |
| *H01L 29/66* | (2006.01) |
| *H01L 21/762* | (2006.01) |
| *H01L 27/088* | (2006.01) |
| *H01L 21/8234* | (2006.01) |
| *H01L 21/308* | (2006.01) |
| *H01L 29/36* | (2006.01) |
| *H01L 21/228* | (2006.01) |
| *H01L 21/265* | (2006.01) |
| *H01L 21/223* | (2006.01) |
| *H01L 21/22* | (2006.01) |
| *H01L 21/02* | (2006.01) |
| *H01L 21/225* | (2006.01) |
| *H01L 21/20* | (2006.01) |
| *H01L 21/306* | (2006.01) |
| *H01L 21/8254* | (2006.01) |
| *H01L 21/8256* | (2006.01) |
| *H01L 21/82* | (2006.01) |
| *H01L 21/8252* | (2006.01) |
| *H01L 29/161* | (2006.01) |

(52) U.S. Cl.
CPC ...... *H01L 21/8254* (2013.01); *H01L 21/8256* (2013.01); *H01L 29/161* (2013.01)

(56) References Cited

U.S. PATENT DOCUMENTS

| | | | | |
|---|---|---|---|---|
| 8,420,459 B1 * | 4/2013 | Cheng | ............... | H01L 29/66477 257/E21.32 |
| 8,497,171 B1 * | 7/2013 | Wu | ................. | H01L 21/823821 438/199 |
| 8,796,695 B2 | 8/2014 | Liao et al. | | |
| 8,809,872 B2 | 8/2014 | Cai et al. | | |
| 8,957,477 B2 | 2/2015 | Chang et al. | | |
| 9,263,549 B2 * | 2/2016 | Rodder | ............. | H01L 29/66537 |
| 9,312,389 B2 | 4/2016 | Ponoth et al. | | |
| 2007/0259467 A1 * | 11/2007 | Tweet | ................. | H01L 31/1812 438/48 |
| 2012/0171832 A1 * | 7/2012 | Toh | ................... | H01L 29/66795 438/300 |
| 2013/0001705 A1 | 1/2013 | Su et al. | | |
| 2014/0319543 A1 * | 10/2014 | Yin | ..................... | H01L 29/0684 257/77 |
| 2016/0013316 A1 * | 1/2016 | Kuang | ............... | H01L 21/0243 257/190 |
| 2016/0197078 A1 * | 7/2016 | Cheng | ............. | H01L 21/823821 257/192 |
| 2016/0218104 A1 | 7/2016 | Wen et al. | | |
| 2016/0233319 A1 * | 8/2016 | Lu | ..................... | H01L 29/66795 |
| 2016/0268260 A1 * | 9/2016 | Lim | ..................... | H01L 27/0924 |

OTHER PUBLICATIONS

Zhenxing Bi, et al., "Dual Channel FinFETs Having Uniform Fin Heights", U.S. Appl. No. 15/811,821, filed Nov. 14, 2017.

* cited by examiner

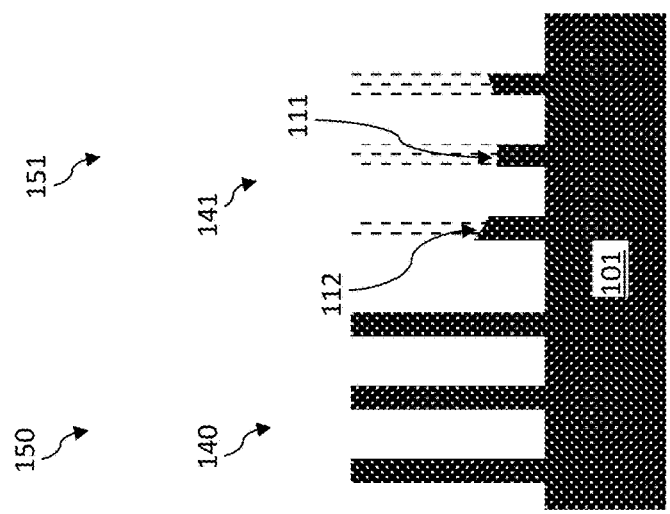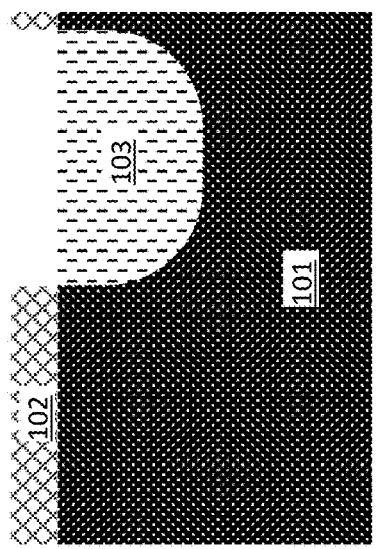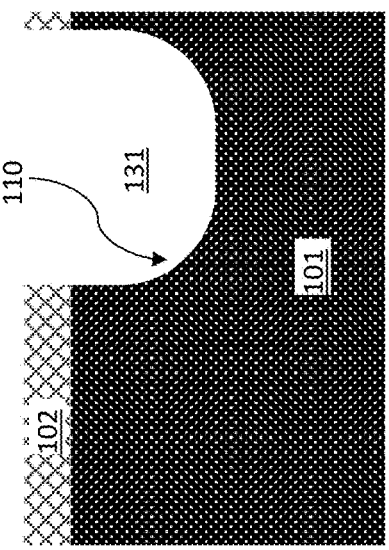

DUAL CHANNEL FINFETS HAVING UNIFORM FIN HEIGHTS

BACKGROUND

Embodiments of the present invention relate in general to complementary metal oxide semiconductor (CMOS) technology, and more specifically, dual channel FinFET devices having uniform fin heights.

CMOS technology is used to construct integrated circuits such as microprocessors, microcontrollers, static random access memory (RAM) and other digital logic circuits. A basic component of CMOS designs is metal oxide semiconductor field effect transistors (MOSFETs).

The FinFET is a type of MOSFET. The FinFET is a double-gate or multiple-gate MOSFET device that mitigates the effects of short channels and reduces drain-induced barrier lowering. The "fin" of a FinFET refers to the narrow channel between source and drain regions. A thin dielectric layer on either side of the fin separates the fin channel from the gate.

SUMMARY

According to one or more embodiments of the invention, a method of making a semiconductor device includes forming a first blanket layer on a substrate; forming a second blanket layer on the first blanket layer; patterning a first fin of a first transistor region and a second fin of a second transistor region in the first blanket layer and the second blanket layer; depositing a mask on the second transistor region; removing the first fin to form a trench; growing a first semiconductor layer in the trench where the first fin was removed; and growing a second semiconductor layer on the first semiconductor layer.

According to other embodiments, a method of making a semiconductor device includes forming a blanket layer of n-doped silicon on a silicon substrate; forming a blanket layer of SiGe on the blanket layer of n-doped silicon; patterning a first fin of an n-type field effect transistor (NFET) and a second fin of a p-type field effect transistor (PFET) in the blanket layer of n-doped silicon and the blanket layer of SiGe; depositing a mask on the second fin of the PFET; depositing a dielectric material around the first fin and the second fin; removing the first fin to form a trench in the dielectric material; performing an epitaxial prebake process to round a bottom edge of the trench; growing a p-doped silicon epitaxial layer in the trench where the first fin was removed; and growing a silicon epitaxial layer on the p-doped epitaxial layer.

Yet, according to other embodiments, a semiconductor device includes a first transistor including a first fin extending from a substrate, the first fin including a p-doped portion extending from the substrate and a silicon portion extending from the p-doped portion, the p-doped portion having a rounded bottom edge; and a second transistor including a second fin extending from the substrate, the second fin including a n-doped portion extending from the substrate and a silicon germanium portion extending from the n-doped portion, the n-doped portion having a substantially flat bottom edge.

BRIEF DESCRIPTION OF THE DRAWINGS

The subject matter which is regarded as embodiments of the invention is particularly pointed out and distinctly claimed in the claims at the conclusion of the specification. The foregoing and other advantages of the embodiments of the invention are apparent from the following detailed description taken in conjunction with the accompanying drawings in which:

FIGS. 1A, 1B, and 1C illustrate a process flow that can result in fin corner rounding and non-uniform fin heights within a plurality of fins, in which:
FIG. 1A shows forming a trench in a substrate;
FIG. 1B shows depositing SiGe in the trench;
and
FIG. 1C shows forming a plurality of fins;
FIGS. 3-10 illustrate a process flow for making semiconductor devices according to embodiments of the invention, in which:
FIG. 3 is a cross-sectional side view of a substrate and blanket layers formed thereon;
FIG. 4 is a cross-sectional side view after patterning fins;
FIG. 5 is a cross-sectional side view depositing a dielectric material on and between the fins;
FIG. 6 is a cross-sectional side view after masking one transistor region and removing the fins in another transistor region;
FIG. 7 is a cross-sectional side view after removing the mask and forming semiconductor material in the first transistor region;
FIG. 8 is a cross-sectional side view after removing excess semiconductor material;
FIG. 9 is a cross-sectional side view after recessing the fins of the second transistor, recessing the dielectric material, and removing the fin caps;
and
FIG. 10 is a cross-sectional side view after forming a gate on the fins.

DETAILED DESCRIPTION

Figure 2:
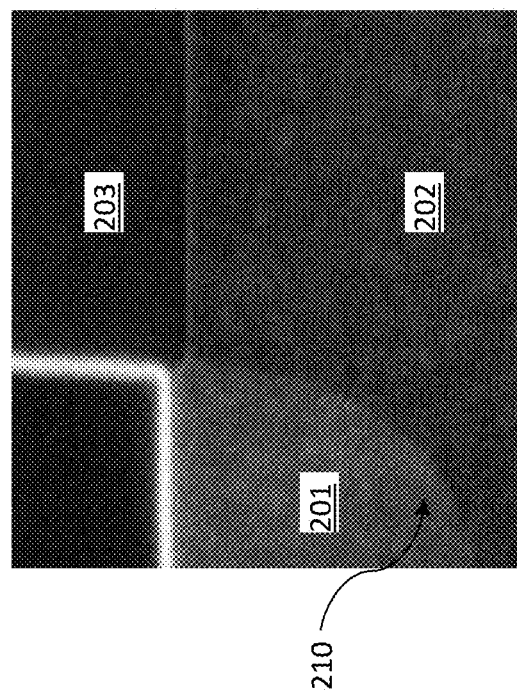
FIG. 2 is an electron micrograph showing SiGe fins with rounded corners.

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature or characteristic, but every embodiment may or may not include the particular structure or characteristic. Moreover, such phrases are not necessarily referring to the same embodiment. Further, when a particular structure or characteristic is described in connection with an embodiment, it is submitted that it is within the knowledge of one skilled in the art to affect such structure or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, silicon germanium (SiGe) PFET devices can be used for 10 nanometer (nm) FinFET nodes and beyond. For CMOS, silicon (Si) NFETs and SiGe PFETs are used. SiGe fins for PFETs can be fabricated by forming a trench in a Si substrate and then epitaxially growing SiGe in the trench, for example, as shown in FIGS. 1A-1C, which is described in further detail below. However, due to practical issues such as trench reactive ion etching (RIE) and epitaxial prebaking, the resulting trench corners can be rounded. After fins are patterned, the rounded corners result in SiGe fins with uneven heights within a plurality of fins. In particular, the portion of the fin at the end of the trench is shorter, due to the rounded corners, than the portions further away from the trench edges. The uneven SiGe fins are not usable and increase the need for NFET-PFET spacing.

FIGS. 1A, 1B, and 1C illustrate a process flow that can result in fin corner rounding and non-uniform fin heights. FIG. 1A shows a silicon substrate 101 with a nitride hardmask 102 disposed thereon. After forming a trench 131 in the substrate 101 by RIE and performing epitaxial prebake processing, the corners 110 of the trench 131 are rounded. Prebake processing is performed before the epitaxial growth process. The purpose of prebake processing is to clean the exposed semiconductor surface by removing contamination so that high quality semiconductor film can be epitaxially grown. Without prebake processing, the semiconductor surface can include contaminants, such as oxygen and/or carbon. The contaminants can cause crystalline defects in the epitaxial film. During prebake processing, semiconductor material, such as silicon, atoms moves to minimize the surface energy. This causes corner rounding at trench corners. Depending on the geometry and semiconductor material, a typical prebake process is performed by annealing wafers in an environment containing hydrogen gas. The prebake temperature ranges from about 600° C. to about 900° C. The prebake duration ranges from a few seconds to a few minutes. The hydrogen pressure ranges from about 0.01 Torr to about 10 Torr. Typically, prebake processing is performed in the same chamber as the epitaxial growth step.

In FIG. 1B, a SiGe region 103 is deposited in the trench 131 using, for example, epitaxial growth processes. In FIG. 1C, fins are patterned and formed. Si fins 140 are formed in a first transistor region 150, and SiGe fins 141 are formed in an adjacent second transistor region 151. The first transistor region 150 will be formed into a NFET device, and the adjacent second transistor region 151 will be formed into a PFET device. The SiGe fins 141 have non-uniform heights due to the rounded trench corners that occurred during the RIE and epitaxial prebake processing, resulting in some shorter SiGe fins 112 and longer SiGe fins 111.

FIG. 2 is an electron micrograph showing SiGe 201 with rounded corners 210. A nitride layer 203 is arranged on a silicon substrate 202, and RIE/epitaxial prebake processing is performed to form a trench with rounded corners. SiGe semiconductor material is disposed in the trench, resulting in uneven SiGe 201. SiGe fins formed in the uneven SiGe region cannot be used for 10 nm and beyond node devices.

Accordingly, various embodiments of the invention described herein provide devices and process flows for forming dual channel FinFET devices that eliminate corner rounding issues and result in substantially uniform height fins amongst a plurality of fins. In one or more embodiments, process flows for forming dual channel FinFET devices include forming blanket layers of semiconductor material on a common substrate, patterning fins of adjacent regions that will be formed into different devices, filling gaps with a dielectric, masking one device region and removing fins from the unmasked device region, and recessing the dielectric to reveal fins of adjacent devices. Turning now to a detailed description of aspects of the present invention, FIGS. 3-10 illustrate a process flow for making semiconductor devices according to embodiments.

Figure 3:
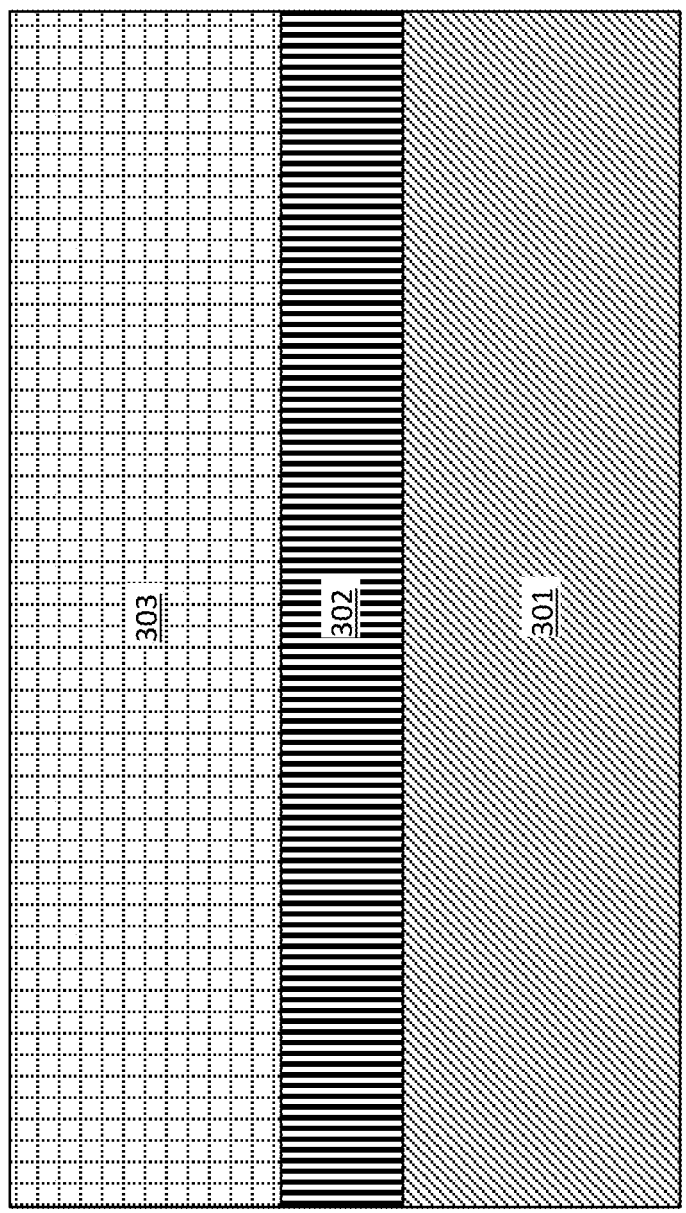

FIG. 3 is a cross-sectional side view of a substrate 301 having a first blanket layer 302 formed thereon. A second blanket layer 303 is formed on the first blanket layer 302. In one or more embodiments of the invention, the first and second blanket layers 302, 303 are formed by suitable epitaxial growth processes. Non-limiting examples of suitable substrate 301 materials include Si (silicon), strained Si, SiC (silicon carbide), Si:C (carbon doped silicon), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

During the epitaxial growth of the first blanket layer 302, the first blanket layer can be doped with a dopant to function as the punchthrough stop (PTS) layer for subsequent processing. When a FinFET transistor is formed, each transistor has a fin channel, a gate, a source, and a drain. The fin channel is controlled by gate. The PTS layer is underneath the fin channel and serves as electrical isolation between source and drain. For an n-type transistor, the source and drain are n-type doped (n-doped). The PTS layer will be p-type doped (p-doped). The p-type PTS electrically isolates the two n-type doped source and drain regions from forming two p-n junctions, one between source and PTS and the other between drain and PTS. For silicon and silicon germanium, n-type dopants include phosphorus, arsenic, and antimony; p-type dopants include boron, gallium, and indium. Using a blanket layer formed by epitaxial growth eliminates the corner rounding challenges that result when trenches are formed by RIE and prebake processing, for example, as described above in FIGS. 1A-1C. Using blanket epitaxy means that no trench is needed. Without a trench, corner rounding challenges are eliminated.

The first blanket layer 302 can be epitaxially grown from gaseous or liquid precursors. The epitaxial growth process can include using vapor-phase epitaxy (VPE), molecular-beam epitaxy (MBE), liquid-phase epitaxy (LPE), or other suitable process. The first blanket layer 302 includes one or more semiconductors, for example, silicon, silicon germanium, and/or carbon doped silicon (Si:C) silicon. The first blanket layer 302 can be doped during deposition by adding a dopant during epitaxy (also called in-situ doping). Alternatively, dopants can be introduced after the epitaxy by using any suitable doping techniques, including but not limited to, ion implantation, gas phase doping, plasma doping, plasma immersion ion implantation, cluster doping, infusion doping, liquid phase doping, solid phase doping, etc. In some embodiments, the first blanket layer 302 is in-situ doped. In some embodiments, the first blanket layer 302 is in-situ doped followed by growing the second blanket layer 303 in the same epitaxy chamber (also called integrated epitaxy). In some embodiments, the first blanket layer 302 and the second blanket layer 303 are grown in two separate epitaxy processes. The material can be doped with an n-type dopant (e.g., phosphorus, arsenic, and/or antimony) or a p-type dopant (e.g., boron, gallium, and/or indium), depending on the type of transistor.

As previously noted herein, the second blanket layer 303 is formed on the first blanket layer 302. Again, using an epitaxially grown blanket layer eliminates the corner rounding problems that result when trenches are formed by RIE and prebake processing. The second blanket layer 303 can be formed by epitaxial growth as described above for the first blanket layer 302.

In exemplary embodiments, substrate 301 is a silicon substrate, first blanket layer 302 is n-type doped silicon, which is used as the PTS for a PFET, and second blanket layer 303 is SiGe.

The thicknesses of the first blanket layer 302 and the second blanket layer 303 generally vary and are not intended to be limited. The thicknesses shown in FIG. 3 are for illustrative purposes only and are not necessarily drawn to scale. In some embodiments, the thickness of the first blanket layer 302 ranges from 20 nm to 60 nm and the thickness of the second blanket layer 303 ranges from 20 nm to 60 nm.

Figure 4:
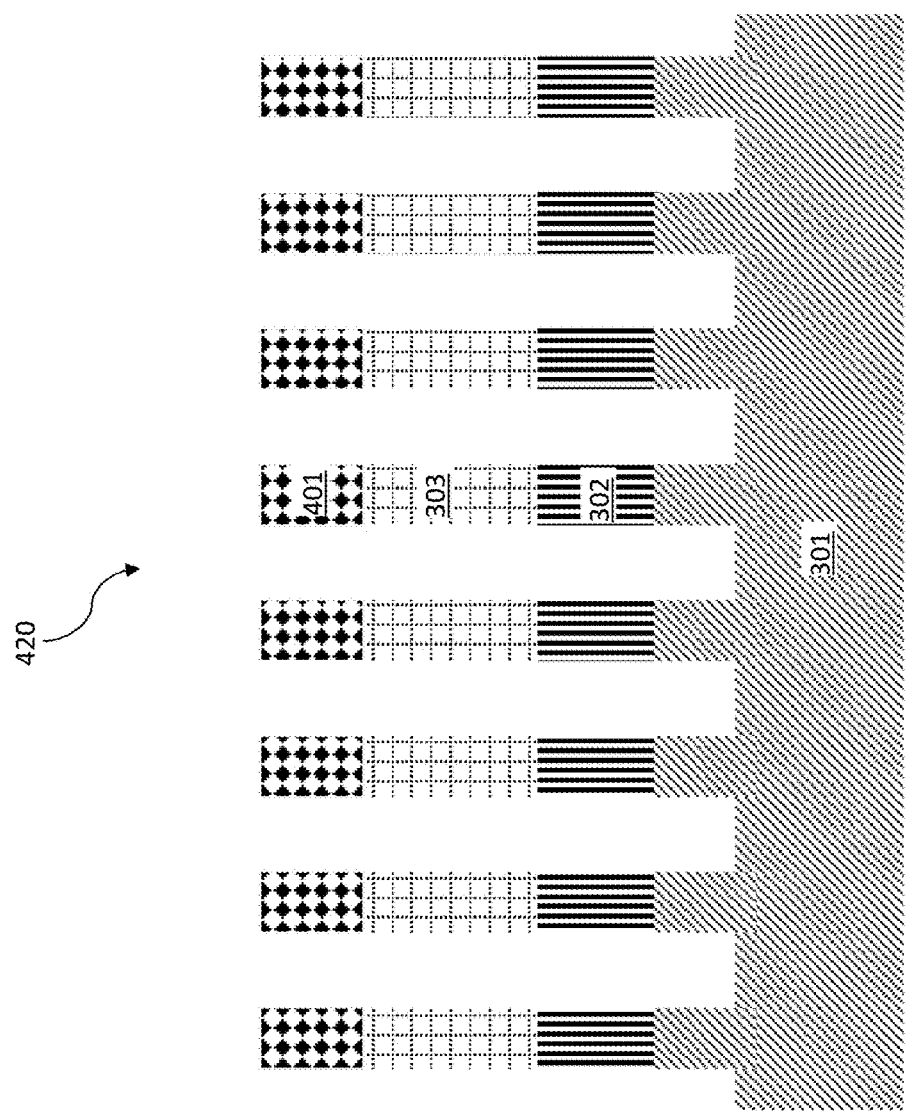

FIG. 4 is a cross-sectional side view after patterning fins 420. A hardmask 401 is first deposited on the second blanket layer 303. The hardmask 401 can include any suitable material or any suitable combination of materials, for example, silicon nitride. Any suitable fin patterning technique, for example, sidewall imaging transfer, is used to form the fins 420. Other suitable patterning technique can also be employed to form fins. The fins 420 extend from the substrate 301, through the first blanket layer 302, second blanket layer 303, and hardmask 401. Although eight (8) fins 420 are shown in FIG. 4, any number of fins 420 can be provided. As described in subsequent Figures, for example, FIGS. 6-10, two transistors are formed on the substrate 301. Therefore, at least one fin is formed in each transistor region (a first transistor region and a second transistor region). Non-limiting examples of fin dimensions are as follows: a lateral width in a range from about 5 to about 12 nm, and a vertical height in a range from about 50 to about 150 nm.

Figure 5:
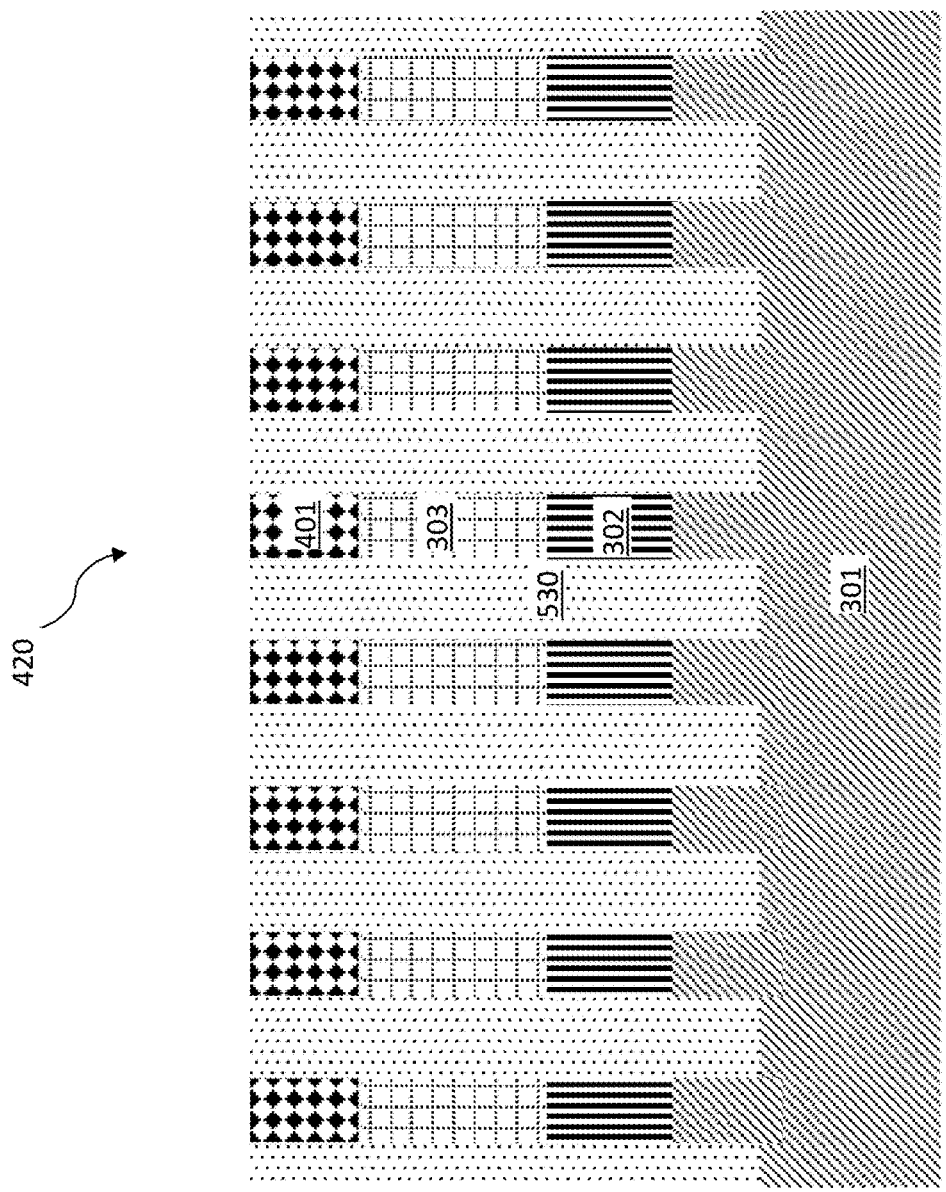

FIG. 5 is a cross-sectional side view depositing a dielectric material 530 on and between the fins 420. After depositing the dielectric material 530, the surface is polished to expose the hardmask 401 on top of the fins 420. The dielectric material 530 forms shallow trench isolation (STI) regions between the fins 420. Non-limiting examples of suitable dielectric materials 530 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Figure 6:
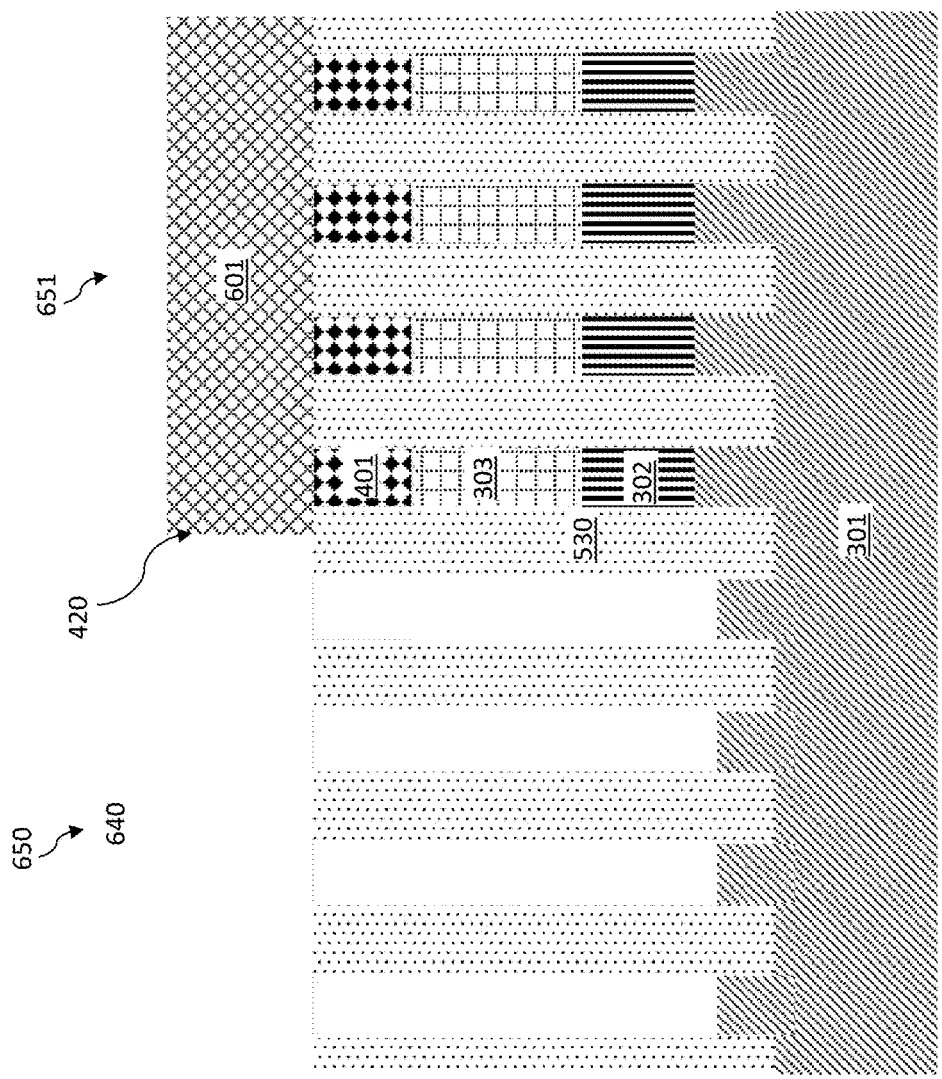

FIG. 6 is a cross-sectional side view after masking one transistor region and removing the fins in a second transistor region. A protective mask 601 is deposited and patterned such that it covers the one transistor (such as second transistor region 651), leaving the adjacent transistor (such as first transistor region 650) exposed. In an exemplary embodiment, first transistor region 650 is an NFET, and second transistor region 651 is a PFET. The protective mask 601 can include a soft-mask layer such as photoresist, or a hardmask layer such as amorphous carbon.

The unprotected transistor, first transistor region 650 as shown in FIG. 6, is etched to remove the exposed fins between the dielectric material 530. The mask 601 protects the fins of the second transistor 651. Removing the exposed fins forms trenches within the dielectric material 530.

The fins of the first transistor can be etched by any one or more suitable etch process(es). The etch processes remove the hardmask 401, second blanket layer 303, and first blanket layer 302. Each material can be removed by dry etch and/or wet etch. In some embodiments, the hardmask 401 includes silicon nitride, the second blanket layer 303 includes SiGe, the first blanket layer 302 includes silicon, and the STI includes silicon oxide. Dry etch processes, such as reactive ion etch (RIE) can be used to remove hard mask 401, second blanket layer 303, and first blanket layer 302, selective to the STI oxide (selective dry etch). Alternatively, wet etching can be used. For example, hot phosphoric acid can be used to remove the hard mask 401 (such as silicon nitride), aqueous solution containing hydrogen peroxide can be used to etch SiGe, and aqueous solution containing ammonia can be used to etch Si.

Figure 7:
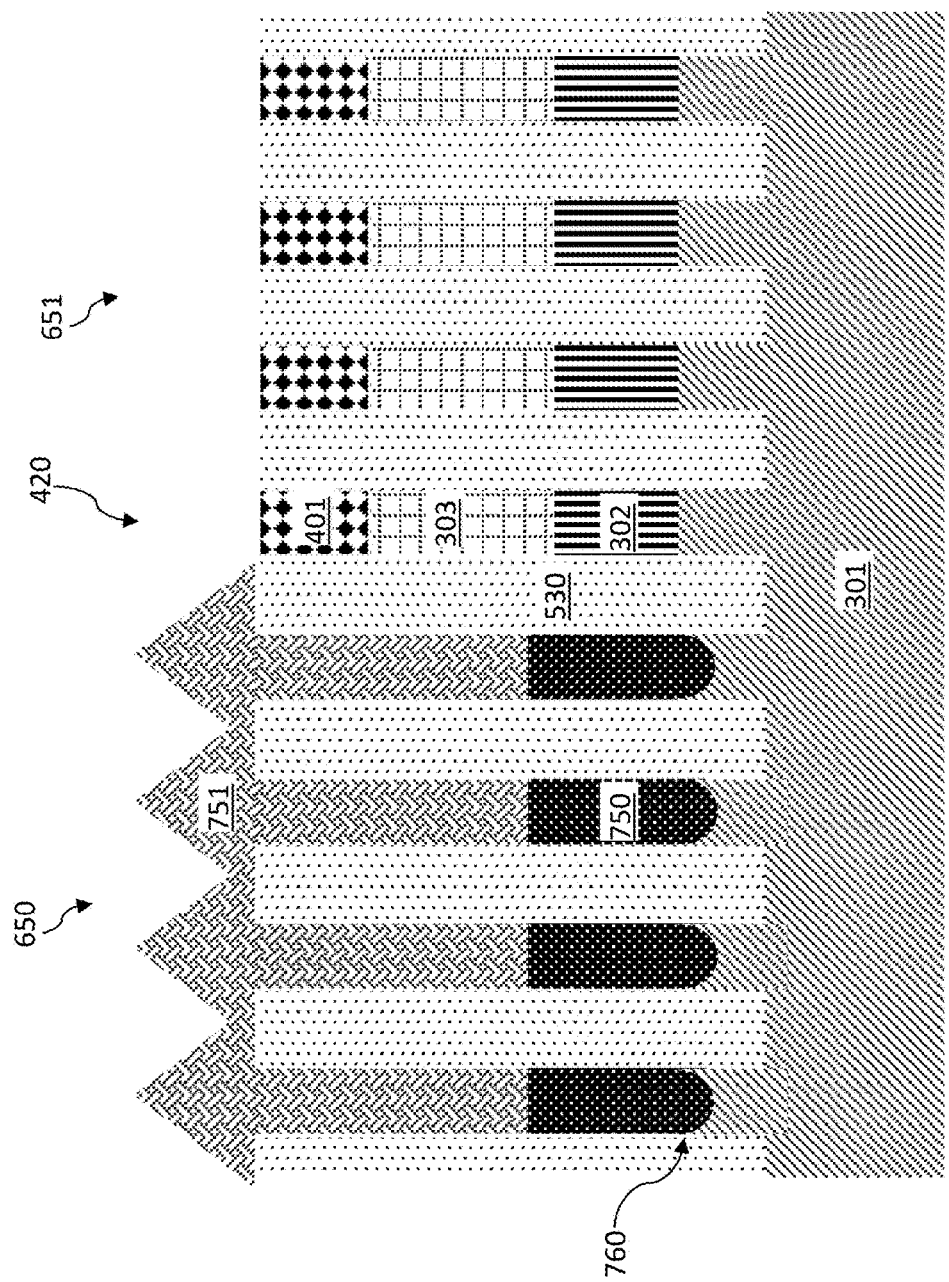

FIG. 7 is a cross-sectional side view after removing the hardmask 601 in region 651 and forming semiconductor material in the first transistor region 650 where the fins were removed. Two layers of semiconductor material are deposited, namely a first layer 750 and a second layer 751. In one or more embodiments of the invention, the first layer 750 and the second layer 751 are deposited by epitaxial growth. In some embodiments, the hardmask 601 is removed after the epitaxy growth of first layer 750 and second layer 751.

Before depositing the first layer 750, epitaxial prebake processing is performed, which can include, for example, annealing wafers in an environment containing hydrogen gas. The prebake temperature ranges from about 600° C. to 900° C. The prebake duration ranges from a few seconds to a few minutes. The hydrogen pressure ranges from about 0.01 Torr to about 10 Torr. Prebake processing forms rounded corners 760 (a rounded bottom edge) in the trenches of the dielectric material 530. However, the rounded corners are confined to each individual fin, as opposed to a plurality of fins, as described in FIGS. 1A-1C. Because each fin includes rounded corners, they will all have substantially uniform heights.

The first layer 750 is doped with a dopant and functions as the PTS layer for subsequent processing. The first layer 750 can be grown epitaxially from gaseous or liquid precursors. The epitaxial growth process can include using vapor-phase epitaxy (VPE), molecular-beam epitaxy (MBE), liquid-phase epitaxy (LPE), or other suitable process. The first layer 750 includes one or more semiconductors, for example, silicon, silicon germanium, and/or carbon doped silicon (Si:C) silicon. The first layer 750 can be doped during deposition by adding a dopant during epitaxy (also called in-situ doping). Alternatively, dopants can be introduced after the epitaxy by using any suitable doping techniques, including but not limited to, ion implantation, gas phase doping, plasma doping, plasma immersion ion implantation, cluster doping, infusion doping, liquid phase doping, solid phase doping, etc. In some embodiments, the first layer 750 is in-situ doped. In some embodiments, the first layer 750 is in-situ doped followed by growing the second layer 750 in the same epitaxy chamber (also called integrated epitaxy). In some embodiments, the first layer 750 and the second layer 751 are grown in two separate epitaxy processes. The material can be doped with an n-type dopant (e.g., phosphorus, arsenic, and/or antimony) or a p-type dopant (e.g., boron, gallium, and/or indium), depending on the type of transistor.

The first layer 750 is deposited to partially fill the trenches of the dielectric material 530. The first layer 750 should fill the trenches to about the level of the first blanket layer 302 of the second transistor region 651.

The second layer 751 is formed on the first layer 751. The second layer 751 can be formed as described above for the first blanket layer 302. The second layer 751 can overgrow over the dielectric material 530, as polishing and/or recessing can be subsequently performed.

In an exemplary embodiment, the first transistor region 650 is an NFET. The first layer 750 is p-type doped Si, and the second layer 751 is Si.

Figure 8:
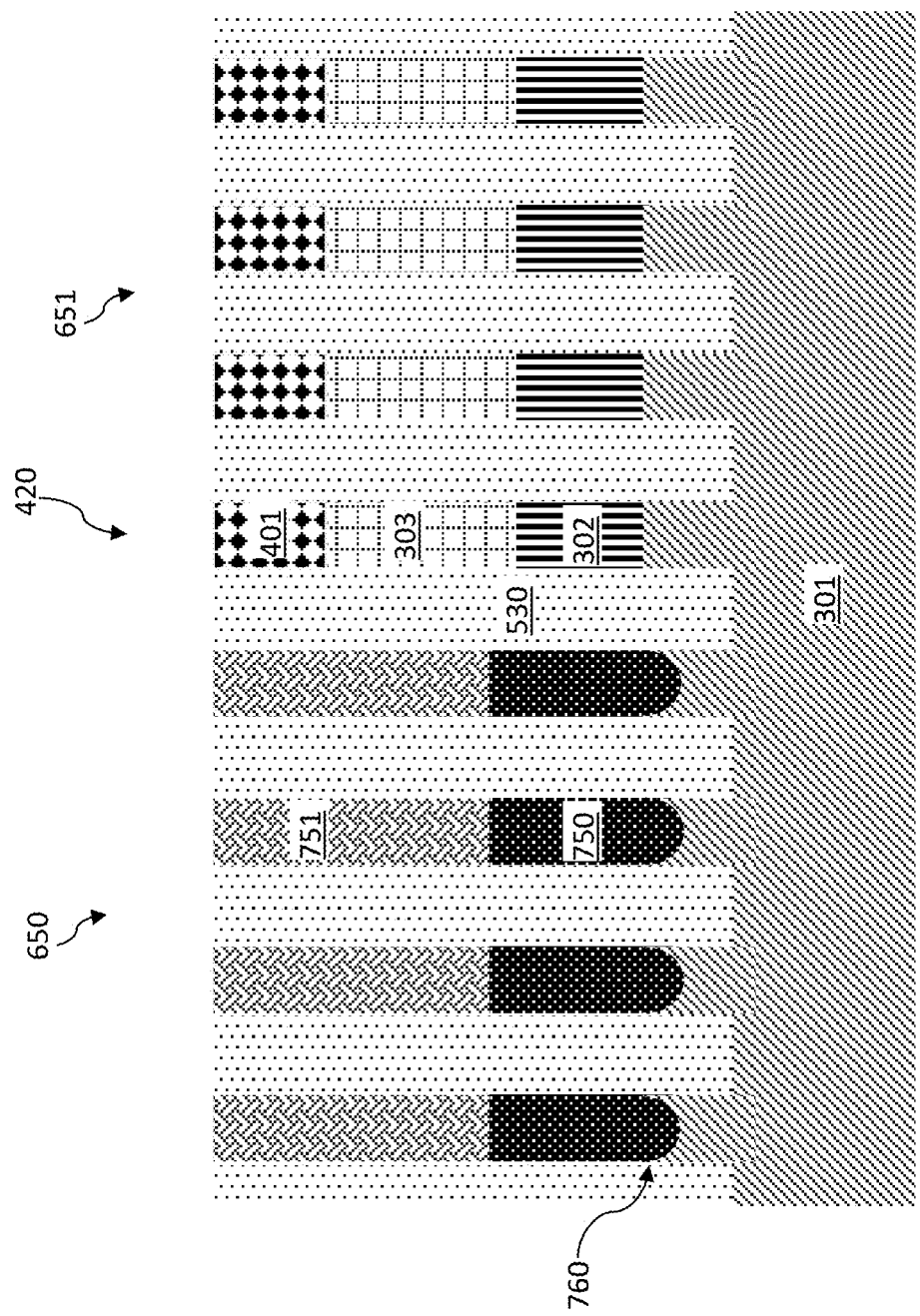

FIG. 8 is a cross-sectional side view after removing excess portions of the second layer 751. Polishing and/or recessing can be performed. Non-limiting examples of polishing and/or recessing processes include planarization processes, such as chemical mechanical planarization (CMP).

Figure 9:
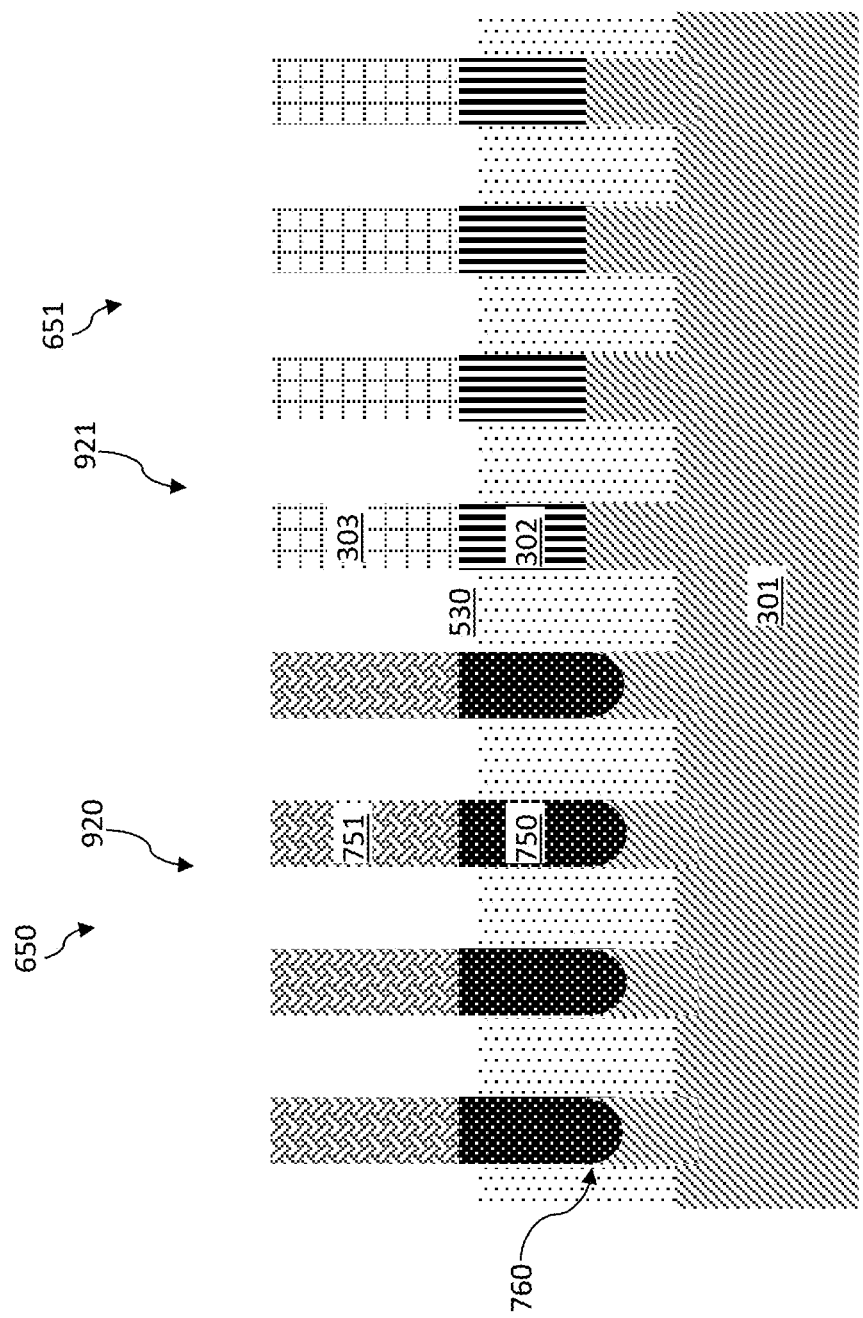

FIG. 9 is a cross-sectional side view after recessing the fins of the first transistor region 650, recessing the dielectric material 530, and removing the fin caps (hard mask 401). One or more etching processes are performed. Each material can be removed by dry etch and/or wet etch. Dry etch processes, such as reactive ion etch (RIE) can be used. Alternatively, wet etching can be used. For example, hot phosphoric acid, an aqueous solution containing hydrogen peroxide, and/or an aqueous solution containing ammonia can be used.

The dielectric material 530 forming the STI regions between the fins is recessed down to a level below the PTS layers (layer 302 and layer 750) of the fins. Non-limiting examples of etch processes for recessing the dielectric material 530 include dry etching, wet etching, or a combination of dry etching and wet etching. Wet etching of the STI oxides can be performed using hydrofluoric acid that is selective to Si and SiGe ("selective" means the process etches oxide at a much faster rate (>10 times) than the Si or SiGe).

Non-limiting examples of etch processes for removing the hardmask 401 include hot phosphoric acid, for example, when the hardmask 401 is silicon nitride.

As a result, first fins 920 are formed in the first transistor region 650 and second fins 921 are formed in the second transistor region 651. In exemplary embodiments, the first transistor region 650 is an NFET, and the first fins 920 are Si fins. The second transistor region is a PFET, and the second fins 921 are SiGe fins. The first fins 920 include PTS layers (first layer 750) with rounded bottoms. The second fins 921 include PTS layers (first blanket layer 302) with flat bottoms (not rounded bottoms or corners).

Figure 10:
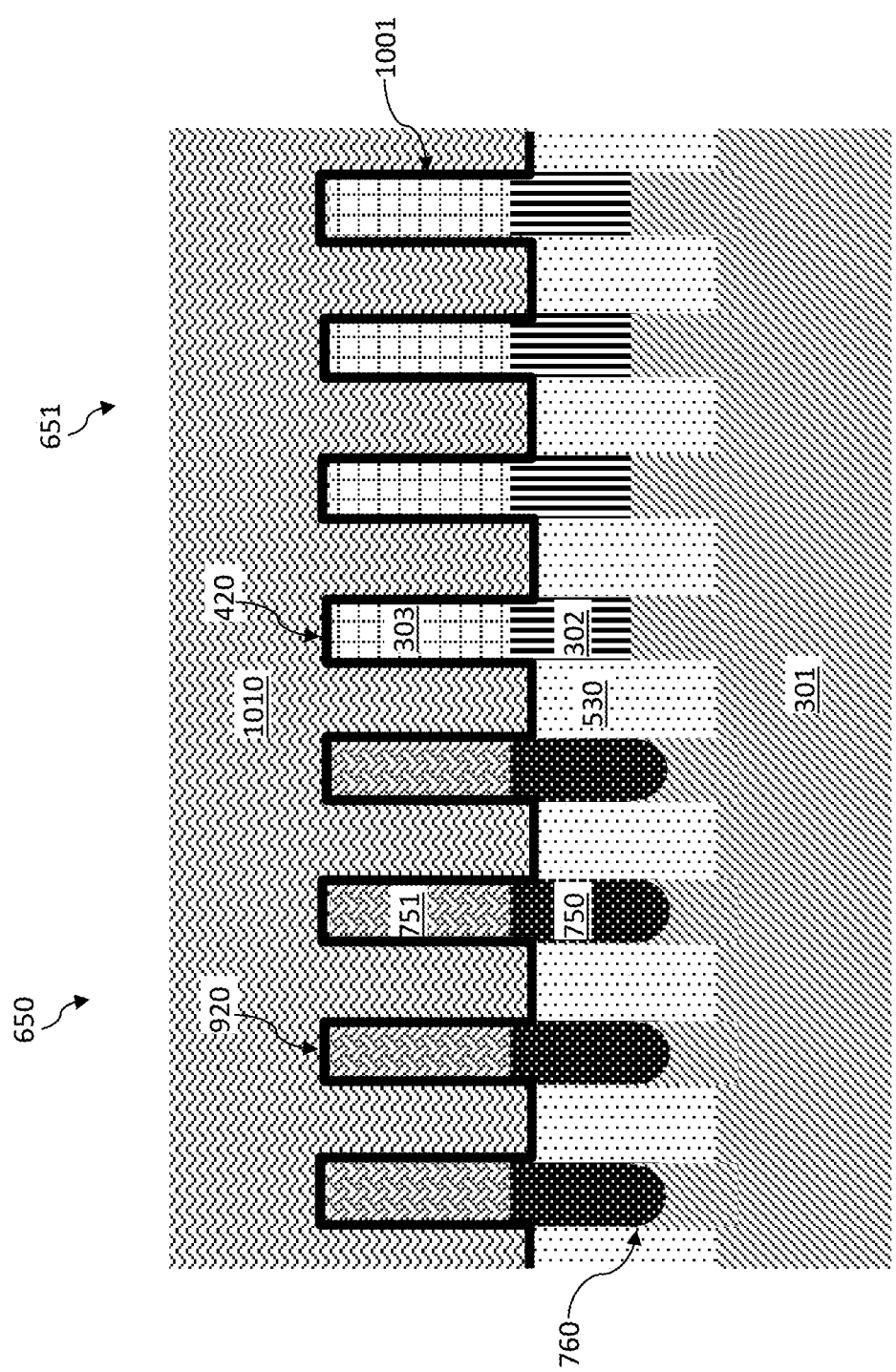

FIG. 10 is a cross-sectional side view after forming a gate 1010 on the fins of the first transistor region 650 and second transistor region 651. The gate 1010 can include a metal gate stack with a gate dielectric layer 1001 deposited directly on the first fins 920 and second fins 921. The gate dielectric layer 1001 can be a dielectric material having a dielectric constant greater than about 3.9, about 7.0, or about 10.0. Non-limiting examples of suitable materials for the dielectric layer 1001 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The gate 1010 can include a work function metal deposited on the gate dielectric layer 1001, followed by a conductive gate material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive material is deposited over the dielectric material(s) and work function layer(s) to form the gate stacks. Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive metal can be deposited by a suitable deposition process, for example, CVD, PECVD, PVD, plating, thermal or e-beam evaporation, and sputtering. Although FIG. 10 shows that both transistors (for example, NFET and PFET) share the same gate, the transistors can have different gate materials. Furthermore, NFET and PFET gates can be electrically connected or disconnected, depending on the applications. In some embodiments, a single conductive material is used to achieve the workfunction and conductive functions.

The above process flows enable close placement of Si and SiGe fins, e.g., for SRAM devices. Furthermore, since SiGe is grown on the blanket Si substrate in embodiments (only the Si surface exposed when SiGe is grown), SiGe can be grown without requiring selectivity. In contrast, when there is another material (e.g., hardmask mask) present in addition to Si (as shown, for example, in FIGS. 1-3), SiGe epitaxy processing needs to be selective, which means that SiGe should be grown only on exposed Si, not on the hardmask. The selective epitaxy narrows the SiGe epitaxy process window.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a n-type field effect transistor (NFET) comprising a plurality of first fins extending from a substrate, each of the plurality of first fins comprising an p-doped silicon portion extending from the substrate and a portion consisting of silicon extending directly from the p-doped silicon portion, the p-doped silicon portion of each of the plurality of first fins having a rounded bottom edge, and the p-doped silicon portion being a single discrete layer of silicon doped with a p-type dopant; and
   a p-type field effect transistor (PFET) comprising a plurality of second fins extending from the substrate, each of the plurality of second fins comprising an n-doped silicon portion extending from the substrate and a portion consisting of silicon germanium extending directly from the n-doped silicon portion, the n-doped silicon portion of each of the plurality of second fins having a substantially flat bottom edge, and the n-doped silicon portion being a single discrete layer of silicon doped with an n-type dopant.

2. The semiconductor device of claim 1, wherein the n-doped silicon portion of the plurality of second fins has a thickness of about 20 to about 60 nanometers.

3. The semiconductor device of claim 1, wherein the portion consisting of silicon germanium of each of the plurality of second fins has a thickness of about 20 to about 60 nanometers.

4. The semiconductor device of claim 1, wherein the p-type dopant is boron.

5. The semiconductor device of claim 1, wherein the p-type dopant is gallium.

6. The semiconductor device of claim 1, wherein the p-type dopant is indium.

7. The semiconductor device of claim 1, wherein the substrate comprises silicon.

* * * * *